(12) United States Patent
Dove et al.

(10) Patent No.: US 6,970,002 B1
(45) Date of Patent: Nov. 29, 2005

(54) TUBE MEASUREMENT AND CALIBRATION SYSTEM

(75) Inventors: John W. Dove, Bloomfield, IN (US);
Craig M. Armes, Odon, IN (US);
Bernard E. Halter, Washington, IN (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/845,610

(22) Filed: May 13, 2004

(51) Int. Cl.[7] .......................... G01R 27/28; G01R 35/00
(52) U.S. Cl. ..................... 324/650; 324/601; 324/76.14
(58) Field of Search ............................... 324/650, 601, 324/629–648, 76.14; 330/43

(56) References Cited

U.S. PATENT DOCUMENTS

| | | | |
|---|---|---|---|
| 4,709,215 A | 11/1987 | McClanahan et al. | |
| 6,445,343 B1 | 9/2002 | Pietrusiak | |
| 6,484,124 B1 * | 11/2002 | MacMullen | 702/182 |
| 6,549,800 B1 * | 4/2003 | Atalar et al. | 600/423 |
| 6,643,597 B1 * | 11/2003 | Dunsmore | 702/104 |
| 6,674,293 B1 * | 1/2004 | Tsironis | 324/638 |
| 6,876,846 B2 * | 4/2005 | Tamaki et al. | D3/207 |
| 2004/0032366 A1 | 2/2004 | Langenberg | |

OTHER PUBLICATIONS

T2003 Printed Master Catalog, http://www.belden.com, Copyright 2003.*
Nusinovich, Rodgers, Chen, Granatstein, Phase Stability in Gyro-Traveling-Wave-Tubes, IEEE Transactions on Electron Devices, vol. 48, No. 7, Jul. 2001.

* cited by examiner

Primary Examiner—Anjan Deb
Assistant Examiner—John Zhu
(74) Attorney, Agent, or Firm—Mark O. Glut

(57) ABSTRACT

A tube measurement and calibration system including a network analyzer for measuring tube radio frequency phase, a calibration adapter for calibrating tube radio frequency power and phase, an amplifier for amplifying input radio frequency power into the tube, and a rigid coaxial cable for radio frequency power communication between the tube and the network analyzer and between the calibration adapter and the network analyzer.

3 Claims, 3 Drawing Sheets

TUBE MEASUREMENT AND CALIBRATION SYSTEM

STATEMENT OF GOVERNMENT INTEREST

The invention described herein may be manufactured and used by or for the Government of the United States of America for governmental purposes without payment of any royalties thereon or therefor.

BACKGROUND

The present invention relates to a calibration and measuring system for tubes. More specifically, but without limitation, the present invention relates to a calibration and measuring system for traveling wave tubes.

A traveling wave tube may be defined, but without limitation, as an amplifier that puts out continuous wave power over a broad range of bandwidth of frequencies, or a tube in which a stream of electrons interacts continuously or repeatedly with a guided electromagnetic wave moving substantially in synchronism with it, and in such a way that there is a net transfer of energy from the stream to the wave.

Traveling wave tubes are used on certain U.S. Navy tactical jamming systems. One jamming system component, in particular, the AN/ALQ-99(V) Band 9/10 Transmitter contains four traveling wave tubes that produce a specified radio frequency power. The four traveling wave tubes must be matched in phase in order for the transmitter to produce the specified radio frequency power, thus, each wave tube must be calibrated and tested to ensure they are matched in phase. Prior methods yielded a phase error which in turn can cause a non operational jamming system.

Thus, there is a need in the art to provide a method or mechanism that incorporates the listed benefits without the limitations inherent in present methods. For the foregoing reasons, there is a need for a calibration and measuring system for traveling wave tubes.

SUMMARY

The present invention is directed to a tube measurement and calibration system including a network analyzer for measuring tube radio frequency phase, a calibration adapter for calibrating tube radio frequency power and phase, an amplifier for amplifying input radio frequency power into the tube, and a rigid coaxial cable for radio frequency power communication between the tube and the network analyzer and between the calibration adapter and the network analyzer.

It is an object of the invention to provide a tube measurement system that allows for almost zero error in phase measurement due to cable flexure.

It is an object of the invention to provide a tube measurement system that can measure wave tubes and ensure they are matched in phase.

DRAWINGS

These and other features, aspects and advantages of the present invention will become better understood with reference to the following description and appended claims, and accompanying drawings wherein:

DESCRIPTION

Figure 1A:
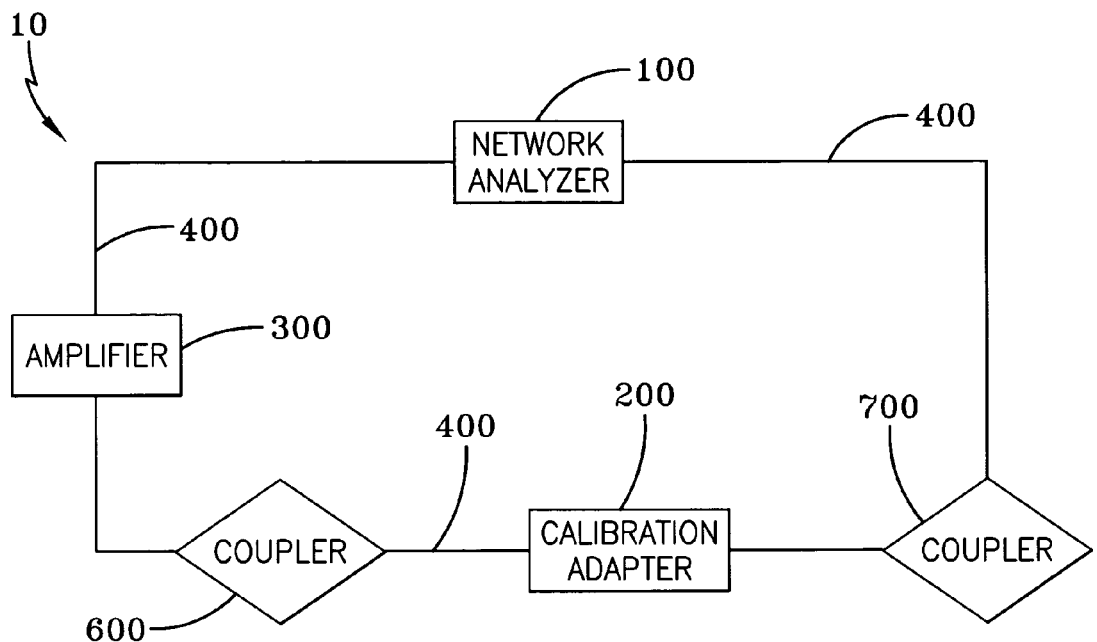
FIG. 1A is a block diagram of an embodiment of the tube measurement and calibration system with the network analyzer attached to the calibration adapter.
Figure 1B:
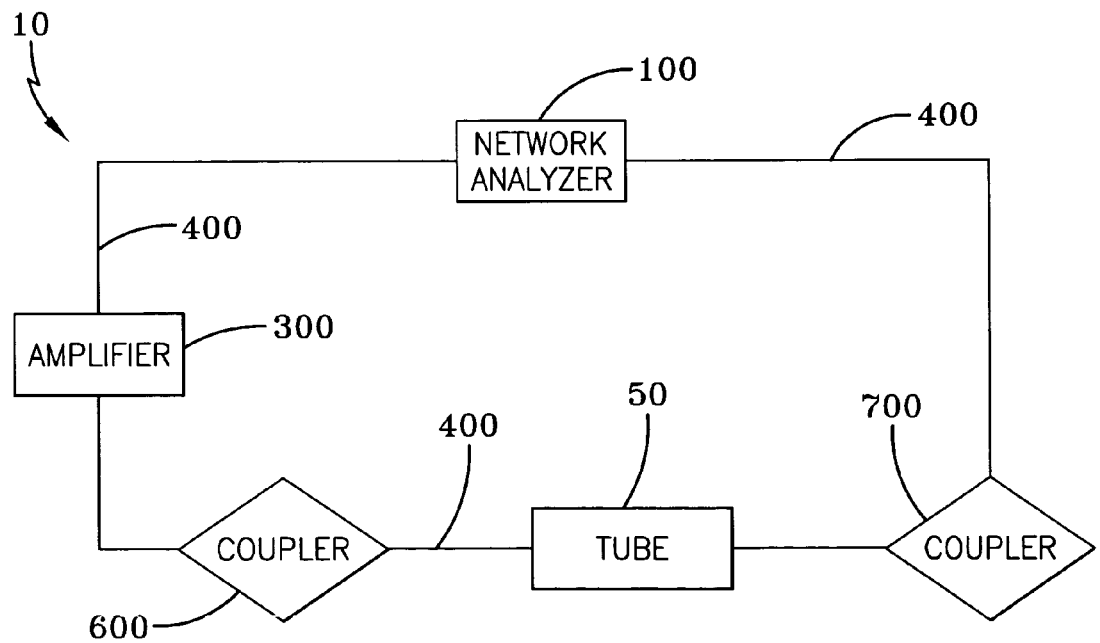
FIG. 1B is a block diagram of an embodiment of the tube measurement and calibration system with the network analyzer attached to the traveling wave tube.

The preferred embodiments of the present invention are illustrated by way of example in FIGS. 1A, 1B, 2 and 3. The tube measurement and calibration system 10 calibrates and measures tubes, specifically traveling wave tubes. The system utilizes a calibration adapter 200 that calibrates the system 10 (specifically the network analyzer 100) to a specified radio frequency power and phase, then a traveling wave tube 50 replaces the calibration adapter 200, and the traveling wave tube 50 is measured and the phase and power are compared to an electronic standard. As seen in FIGS. 1A and 1B, the tube measurement and calibration system 10 or kit for measuring and calibrating traveling wave tubes includes: a network analyzer 100 for measuring tube radio frequency power; a calibration adapter 200 for calibrating tube radio frequency power and phase (FIG. 1A); an amplifier 300 for amplifying input radio frequency power; and a rigid coaxial cable 400 for radio frequency power communication between the traveling wave tube 50 to be measured and calibrated and the network analyzer 100 (FIG. 1B), and between the calibration adapter 200 and the network analyzer 100 (FIG. 1A).

In the preferred embodiment of the invention, there is an input coupler 600 and an output coupler 700. The input coupler 600 is located between the amplifier 300 and the traveling wave tube 50 or calibration adapter 200, while the output coupler 700 is located between the traveling wave tube 50 or calibration adapter 200 and the network analyzer 100.

In the discussion of the present invention, the system will be discussed in a tactical jamming system environment, specifically for use with a traveling wave tube 50, however, the system can also be utilized for any other types of tubes, as practicable.

A network analyzer 100 may be defined, but without limitation, as a two-port radio frequency measurement instrument used to measure forward and reverse scattering parameters in both magnitude and phase. The preferred type of network analyzer 100 is an HP8510. The HP8510 vector network analyzer (VNA) is an integrated stimulus/response test system that measures the magnitude and phase characteristics of a 1-port or 2-port network by comparing the incident signal with the signal transmitted through the device or reflected from its inputs. A network analyzer 100 may provide, but without limitation, a waveform with a specified attenuation and frequency as inputs to the network or device under test. It then measures the magnitude and phase information of both the reflected and transmitted waves.

The HP8510 VNA is used in the tube measurement and calibration system 10, which can also be referred to as a Rigid Phase Measurement System, to determine the gain and insertion phase of a traveling wave tube 50. The HP8510 or any network analyzer 100 with proper calibration will provide, with great accuracy, the sloped input stimulus power required for radio frequency drive of the traveling wave tube 50. The HP8510 VNA response system is a tuned receiver allowing it to ignore harmonic and spurious output of the tube and measure only the true usable power.

A calibration adapter 200 may be defined, but without limitation, as a device of known phase length used to substitute for the measured traveling wave tube 50 during calibration of the network analyzer 100 system. The preferred type of calibration adapter 200 includes radio frequency input and output ports physically located in the same spatial position as the traveling wave tube(s) 50 to be measured.

Figure 2:
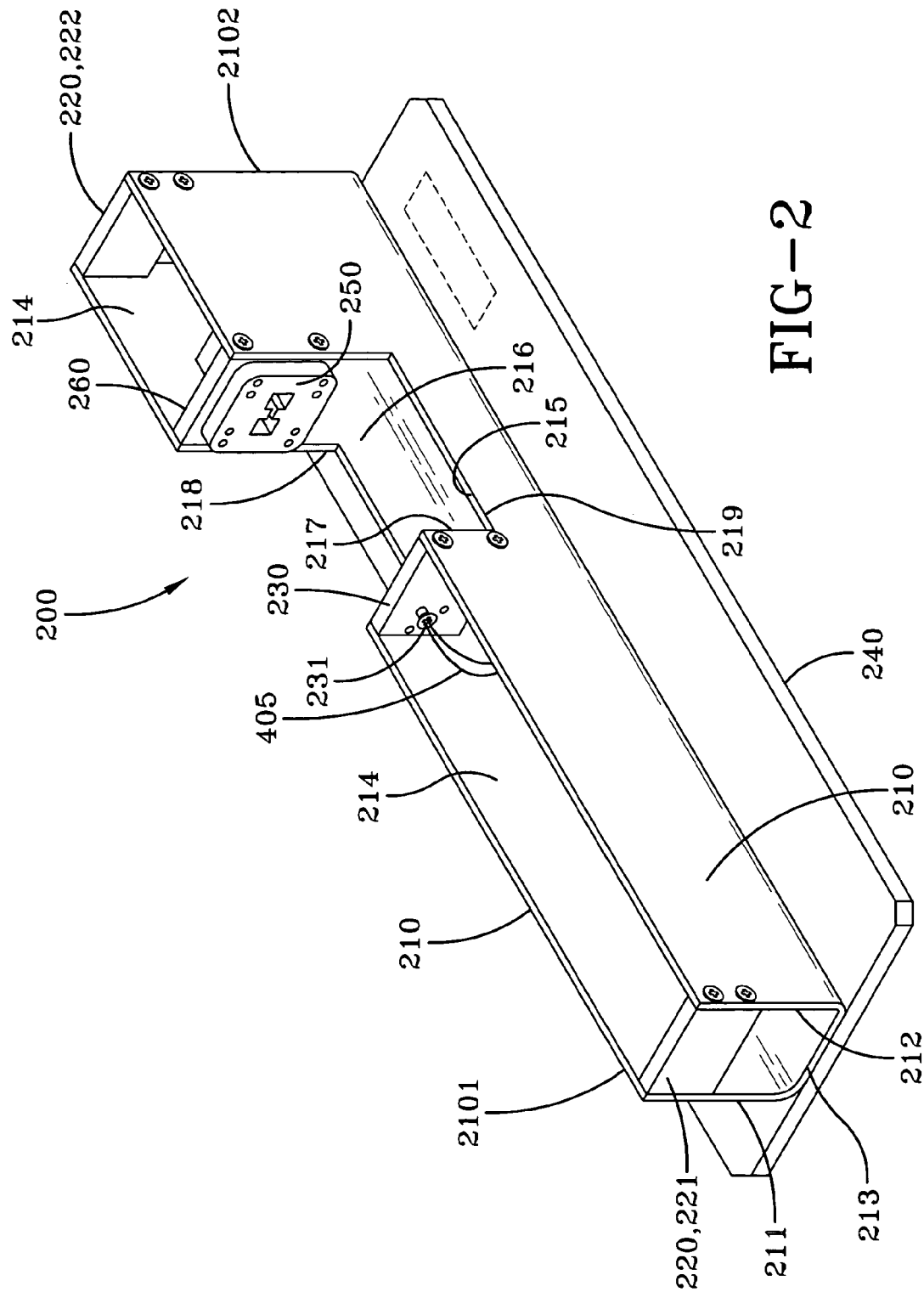
FIG. 2 is an embodiment of the calibration adapter.

As seen in FIG. 2, in the preferred embodiment, the calibration adapter 200 includes a chassis 210, two end brackets 220, a connector bracket 230, a base plate 240, a waveguide adapter 250, and waveguide adapter bracket 260. The chassis 210 may have a substantially unshaped cross section and may be disposed on top of the base plate 240. The chassis 210 may include a first upward projection portion 211, a second upward projection portion 212 and a chassis base 213. The first upward projection portion 211 and the second upward projection portion 212 may be substantially perpendicular to the chassis base 213, substantially parallel to each other, disposed on opposite ends of the chassis base 213, and may create a chassis cavity 214. The chassis base 213 may be parallel to and disposed on the base plate 240. The chassis 210 may also have a first chassis end portion 2101 and a second chassis end portion 2102. As seen in FIG. 2, the first upward projection 211 and the second upward projection 212 may each have a notch 215 that is matching and together they may create a gain 216. In the preferred embodiment the notch 215 and the gain 216 may be closer to or in the second chassis end portion 2102. The notch 215 may have a first notch portion 217, a second notch portion 218 and a base notch portion 219. As seen in FIG. 2, the section of upward projection portions 211, 212 closer to or in the second chassis end portion 2102 (or the portion corresponding to the second notch portion 218) may be higher or taller than the section of upward projection portions closer to or in the first chassis end portion 2101 (or the portion corresponding to the first notch portion 217).

The two end brackets 220 may be located in the upper part of the chassis 210 and may be disposed between the first upward projection 211 and the second upward projection 212. The top portion of the end brackets 220 may be flush with the top portions of the two upward projections 211, 212. A first end bracket 221 may be located at the first chassis end portion 2101 and a second end bracket 222 may be located at the second chassis end portion 2102.

The connector bracket 230 may be located in the upper part of the chassis 210 at the notch 215, disposed between the first upward projection 211 and the second upward projection 212, and perpendicular to the first upward projection 211 and the second upward projection 212. In the preferred embodiment, the connector bracket 230 is located at the first notch portion 217. The waveguide adapter bracket 260 may be located in the upper part of the chassis 210 at the notch 215, disposed between the first upward projection 211 and the second upward projection 212, and perpendicular to the first upward projection 211 and the second upward projection 212. In the preferred embodiment, the waveguide adapter bracket 260 is located at the second notch portion 218.

The waveguide adapter 250 may be located against the waveguide adapter bracket 260. In the preferred embodiment there is an internal rigid coaxial cable 405. The internal rigid coaxial cable 405 allows radio frequency power communication between the waveguide adapter 250 and a connector bracket portal 231 located on the connector bracket 230.

In the preferred embodiment, the chassis 210 may be extruded rectangular tubing. The tubing may be manufactured from an aluminum alloy and the surface finished with chemical film treatment IAW Mil-C-5541, Class 1A However, any type of material that lends itself to this application may be used. The base plate 240, the waveguide adapter bracket 260, the connector bracket 230, and the end brackets 220 may be an aluminum alloy surface finished with chemical film treatment IAW Mil-C-5541, Class 1A. However, any type of material that lends itself to this application may be used.

An amplifier 300 may be defined, but without limitation, as a device which, by enabling a received wave to control a local source of power, is capable of delivering an enlarged copy of the wave. The preferred type of amplifier 300 is the Agilent RF Amplifier 8449B. The RF (Radio Frequency) 8449B is a high-gain, low-noise RF signal amplifier. The 8449B is used in the Rigid Phase Measurement System to increase the RF Power of the HP8510 VNA output to the level of input needed by the traveling wave tube 50.

A rigid coaxial cable 400 may be defined, but without limitation, as a stiff, unyielding, not flexible transmission line in which one conductor completely surrounds the other, the two being coaxial and separated by a continuous solid dielectric or by dielectric spacers. The preferred type of rigid coaxial cable 400 is copper jacketed, 50 ohm impedance, Teflon dielectric, 0.140 inch outer diameter hand formable cable.

Figure 3:
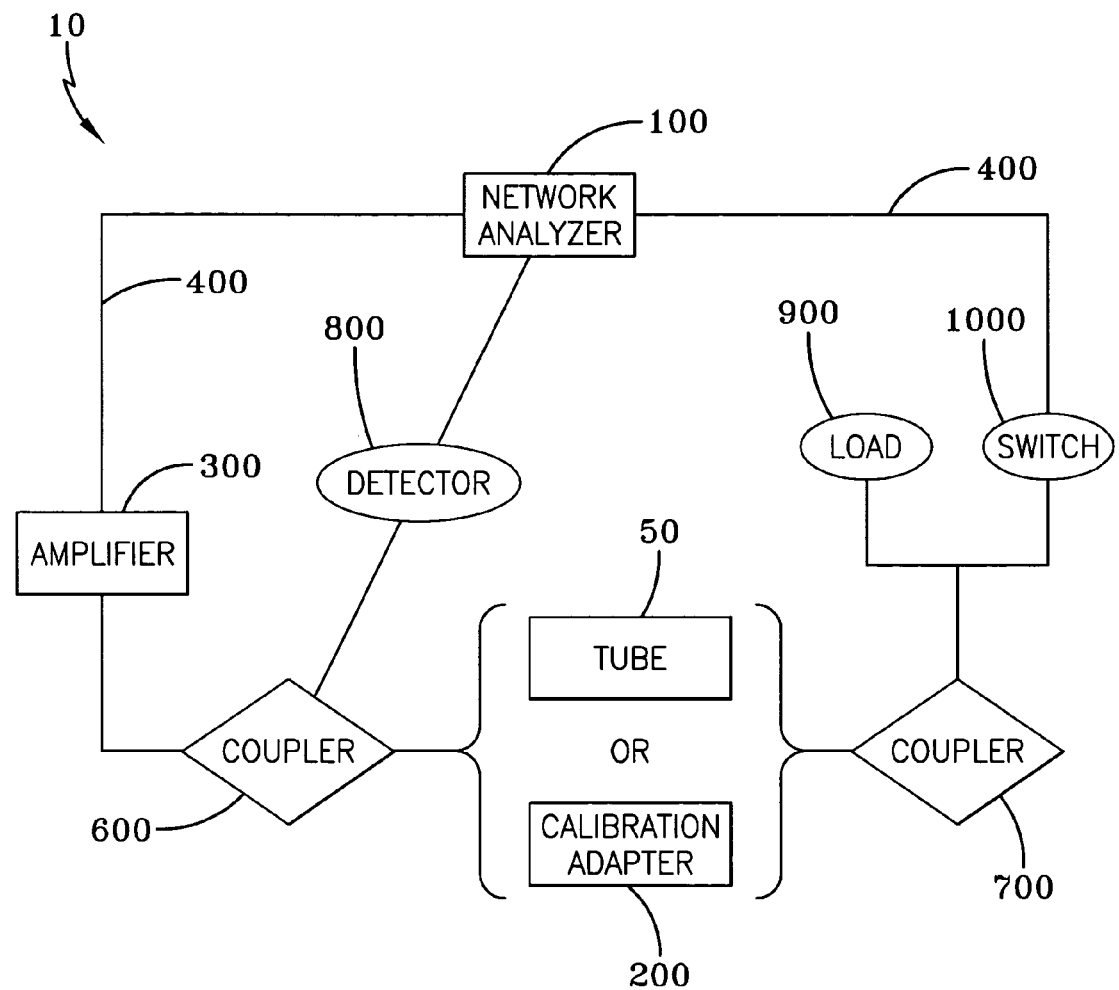
FIG. 3 is a block diagram of another embodiment of the tube measurement and calibration system.

A coupler may be defined, but without limitation, as an apparatus that allows power or energy to be converted to another type of energy and/or transferred from one point to another. The input coupler 600 receives radio frequency input from the amplifier 300. As seen in FIG. 3, in one of the preferred embodiments, the signal is split with the majority of the signal going to the traveling wave tube 50 input and a small sample signal (about −10 dB) going to a radio frequency detector 800. The radio frequency detector 800 changes the radio frequency to a direct current (DC) voltage. This DC voltage is sent to the network analyzer 100. This DC voltage is used to maintain the radio frequency signal at a constant power level throughout testing. Without this leveling signal the radio frequency input signal could increase or decrease with temperature change. The output coupler 700 receives a high power (approximately 400 Watt) radio frequency signal from the traveling wave tube 50. The signal is split with the majority of the signal being sent to a water-cooled load 900 to dissipate the power produced by the traveling wave tube 50. A small sample signal (about −50 dB) is sent to a two position radio frequency switch 1000. The switch 1000, under software control, directs the radio frequency signal to a port to measure radio frequency power with a power meter or to a port to measure signal phase using the network analyzer 100.

In operation, the calibration adapter 200 calibrates the system, specifically the network analyzer 100, to the specified radio frequency power. As seen in FIG. 1A, one or more rigid coaxial cables 400 connect (indirectly or directly) the network analyzer 100 to the calibration adapter 200. Once the system/network analyzer 100 has been calibrated then the calibration adapter 200 may be disconnected from the network analyzer 100, and, as seen in FIG. 1B, a traveling wave tube may be attached (indirectly or directly) to the network analyzer 100. The traveling wave tube 50 is then calibrated to be matched in phase with the calibration adapter 200. After the required number of traveling wave tubes are matched in phase they may be used in a tactical jamming system, such as the AN/ALQ-99(V) Band 9/10 Transmitter.

When introducing elements of the present invention or the preferred embodiment(s) thereof, the articles "a," "an," "the," and "said" are intended to mean there are one or more of the elements. The terms "comprising," "including," and "having" are intended to be inclusive and mean that there may be additional elements other than the listed elements.

Although the present invention has been described in considerable detail with reference to certain preferred versions thereof, other versions are possible. Therefore, the spirit and scope of the appended claims should not be limited to the description of the preferred versions contained herein.

What is claimed is:

1. A kit for measuring and calibrating traveling wave tubes comprising:
   a network analyzer for measuring tube radio frequency power and phase;
   a calibration adapter for calibrating tube radio frequency power;
   an amplifier for amplifying input radio frequency power into the tube;
   rigid coaxial cables for radio frequency power communication between the tube and the network analyze and between the network analyzer and the calibration adapter, the rigid coaxial cables are copper jacketed, 50 ohm impedance, Teflon dielectric, hand formable cables, the calibration adapter comprises of a waveguide adapter, a connector bracket portal, and radio frequency input and output ports physically located in the same spatial position as the traveling wave tube to be measured, one of the rigid coaxial cables allowing radio frequency power communication between the connector bracket portal and the network analyzer, another rigid coaxial cable allowing radio frequency power between the waveguide adapter and the network analyzer; and,
   an input coupler and an output coupler, the input coupler for receiving radio frequency input from the amplifier and splitting it, with the majority of the radio frequency passing to the traveling wave tube and a small sample signal going to a radio frequency detector, the output coupler for sampling the radio frequency signal from the traveling wave tube, with the majority sent to a water-cooled load to dissipate the power produced by the traveling wave tube.

2. A kit for measuring and calibrating traveling wave tubes of claim 1, wherein the network analyzer is an integrated stimulus/response test system that measures the magnitude and phase characteristics of a 1-port or 2-port network by comparing an incident signal with a signal transmitted through the network analyzer or reflected from its inputs.

3. A kit for measuring and calibrating traveling wave tubes of claim 2, wherein the calibration adapter comprises of a chassis and a waveguide adapter, the waveguide adapter disposed on the chassis, the waveguide adapter in radio frequency power communication with the network analyzer via one of the rigid coaxial cables.

* * * * *

UNITED STATES PATENT AND TRADEMARK OFFICE
CERTIFICATE OF CORRECTION

PATENT NO. : 6,970,002 B1
DATED : November 29, 2005
INVENTOR(S) : Dove et al.

It is certified that error appears in the above-identified patent and that said Letters Patent is hereby corrected as shown below:

Column 3,
Line 13, should read -- The chassis 210 may have a substantially u-shaped cross --.

Column 5,
Line 25, should read -- nication between the tube and network analyzer and --.

Column 6,
Line 13, should read -- coupler for splitting the radio frequency signal from --.

Signed and Sealed this

Thirty-first Day of January, 2006

JON W. DUDAS
*Director of the United States Patent and Trademark Office*